United States Patent
Kim et al.

(10) Patent No.: US 11,086,210 B2
(45) Date of Patent: Aug. 10, 2021

(54) PHOTOMASK, METHOD OF FABRICATING THE SAME, AND METHOD OF MANUFACTURING SEMICONDUCTOR DEVICE USING THE SAME

(71) Applicant: Samsung Electronics Co., Ltd., Suwon-si (KR)

(72) Inventors: Yigwon Kim, Hwaseong-si (KR); Sangjin Kim, Suwon-si (KR); Heeyoung Go, Yongin-si (KR); Heebom Kim, Hwaseong-si (KR); Hoon Kim, Suwon-si (KR); Hong-Seock Choi, Bucheon-si (KR); Jinseok Heo, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 142 days.

(21) Appl. No.: 16/578,628

(22) Filed: Sep. 23, 2019

(65) Prior Publication Data
US 2020/0225572 A1     Jul. 16, 2020

(30) Foreign Application Priority Data
Jan. 14, 2019   (KR) .................. 10-2019-0004779

(51) Int. Cl.
*G03F 1/24*    (2012.01)

(52) U.S. Cl.
CPC .................. *G03F 1/24* (2013.01)

(58) Field of Classification Search
CPC .................................................. G03F 1/24
USPC .................................................. 430/5
See application file for complete search history.

(56) References Cited

U.S. PATENT DOCUMENTS

| | | |
|---|---|---|
| 6,372,390 B1 | 4/2002 | Liu et al. |
| 7,001,694 B2 | 2/2006 | Misaka |
| 8,048,594 B2 | 11/2011 | Hashimoto et al. |
| 9,715,175 B2 | 7/2017 | Ota |
| 2017/0345725 A1 | 11/2017 | Hu et al. |
| 2018/0253008 A1 | 9/2018 | Lu et al. |
| 2018/0259841 A1 | 9/2018 | Nozawa et al. |

FOREIGN PATENT DOCUMENTS

| | | |
|---|---|---|
| JP | 2001-272768 A | 10/2001 |
| JP | 3342693 B2 | 11/2002 |
| JP | 4881633 B2 | 2/2012 |

*Primary Examiner* — Christopher G Young
(74) *Attorney, Agent, or Firm* — Harness, Dickey & Pierce, P.L.C

(57) ABSTRACT

Disclosed are photomasks, methods of fabricating the same, and methods of manufacturing semiconductor devices using the same. The photomask comprises a substrate including a pattern region and a peripheral region around the pattern region, a reflection layer on the pattern region and extending onto the peripheral region, an absorption structure on the reflection layer, and a dielectric pattern on the absorption structure on the peripheral region and exposing the absorption structure on the pattern region.

20 Claims, 12 Drawing Sheets

PHOTOMASK, METHOD OF FABRICATING THE SAME, AND METHOD OF MANUFACTURING SEMICONDUCTOR DEVICE USING THE SAME

CROSS-REFERENCE TO RELATED APPLICATION

This U.S. nonprovisional application claims priority under 35 U.S.C § 119 to Korean Patent Application No. 10-2019-0004779 filed on Jan. 14, 2019 in the Korean Intellectual Property Office, the entire contents of which are hereby incorporated by reference.

BACKGROUND

The present inventive concepts relate to a photomask, a method of fabricating the same, and a method of manufacturing a semiconductor device using the same.

To satisfy high performance and low cost demanded by users, formation of smaller patterns on a semiconductor substrate has been increasingly requested. To satisfy these technical demands, the wavelength of a light source used in a lithography process has become shorter. For example, in the past, the lithography process utilized light having a g-line wavelength band (e.g., 436 nm) or i-line wavelength band (e.g., 365 nm). Use of light having a deep-ultraviolet or extreme ultraviolet (EUV) wavelength band is becoming more prevalent. As light having an EUV wavelength band is mostly absorbed by refractive optical materials, an EUV lithography generally utilizes a reflective optical system instead of a refractive optical system. For example, the EUV lithography uses a reflective photomask whose reflective side is provided thereon with circuit patterns supposed to be transferred to a wafer.

SUMMARY

Some example embodiments of the present inventive concepts provide a photomask and a method of fabricating the same in which the occurrence of defects is reduced or minimized.

Some example embodiments of the present inventive concepts provide a method of manufacturing a semiconductor device, which method is capable of reducing or minimizing the occurrence of pattern defects.

According to some example embodiments of the present inventive concepts, a photomask may include, a substrate including a pattern region and a peripheral region around the pattern region, a reflection layer on the pattern region and extending onto the peripheral region, an absorption structure on the reflection layer, and a dielectric pattern on the absorption structure on the peripheral region and exposing the absorption structure on the pattern region.

According to some example embodiments of the present inventive concepts, a photomask may include, a substrate including a pattern region and a peripheral region around the pattern region, a reflection layer and an absorption structure sequentially stacked on the substrate, and a dielectric pattern on the absorption structure on the peripheral region, wherein the dielectric pattern has a ring shape extending along an edge of the substrate.

According to some example embodiments of the present inventive concepts, a method of fabricating a photomask may include, providing a substrate including a pattern region and a peripheral region around the pattern region, sequentially forming a reflection layer, a preliminary layer, and a dielectric layer on the substrate, forming a first mask pattern on the dielectric layer, the first mask pattern including a first mask opening that exposes the dielectric layer on the pattern region, forming a dielectric pattern on the peripheral region by etching the dielectric layer using the first mask pattern as an etching mask, and forming a plurality of absorption patterns on the pattern region by etching the preliminary absorption layer exposed by the dielectric pattern.

According to some example embodiments of the present inventive concepts, a method of fabricating a photomask may include, providing a substrate including a pattern region and a peripheral region around the pattern region; sequentially forming a reflection layer and a preliminary layer on the substrate, forming a dielectric layer on the preliminary absorption layer on the peripheral region, and forming a plurality of absorption patterns on the pattern region by etching the preliminary absorption layer exposed by the dielectric layer.

According to some example embodiments of the present inventive concepts, a method of manufacturing a semiconductor device may include, forming a photoresist layer on a wafer, forming a plurality of photoresist patterns by performing exposure and development processes on the photoresist layer, and forming a plurality of circuit patterns on the wafer by performing an etching process using the photoresist patterns as an etching mask, wherein the exposure process may be an extreme ultraviolet (EUV) exposure process using a reflective photomask, the reflective photomask may include, a substrate including a pattern region and a peripheral region around the pattern region, a reflection layer and an absorption structure sequentially stacked on the substrate, and a dielectric pattern on the absorption structure on the peripheral region, and the dielectric pattern may have a ring shape extending along an edge of the substrate.

DETAILED DESCRIPTION

The following will now describe in detail some example embodiments of the present inventive concepts in conjunction with the accompanying drawings.

Figure 1:
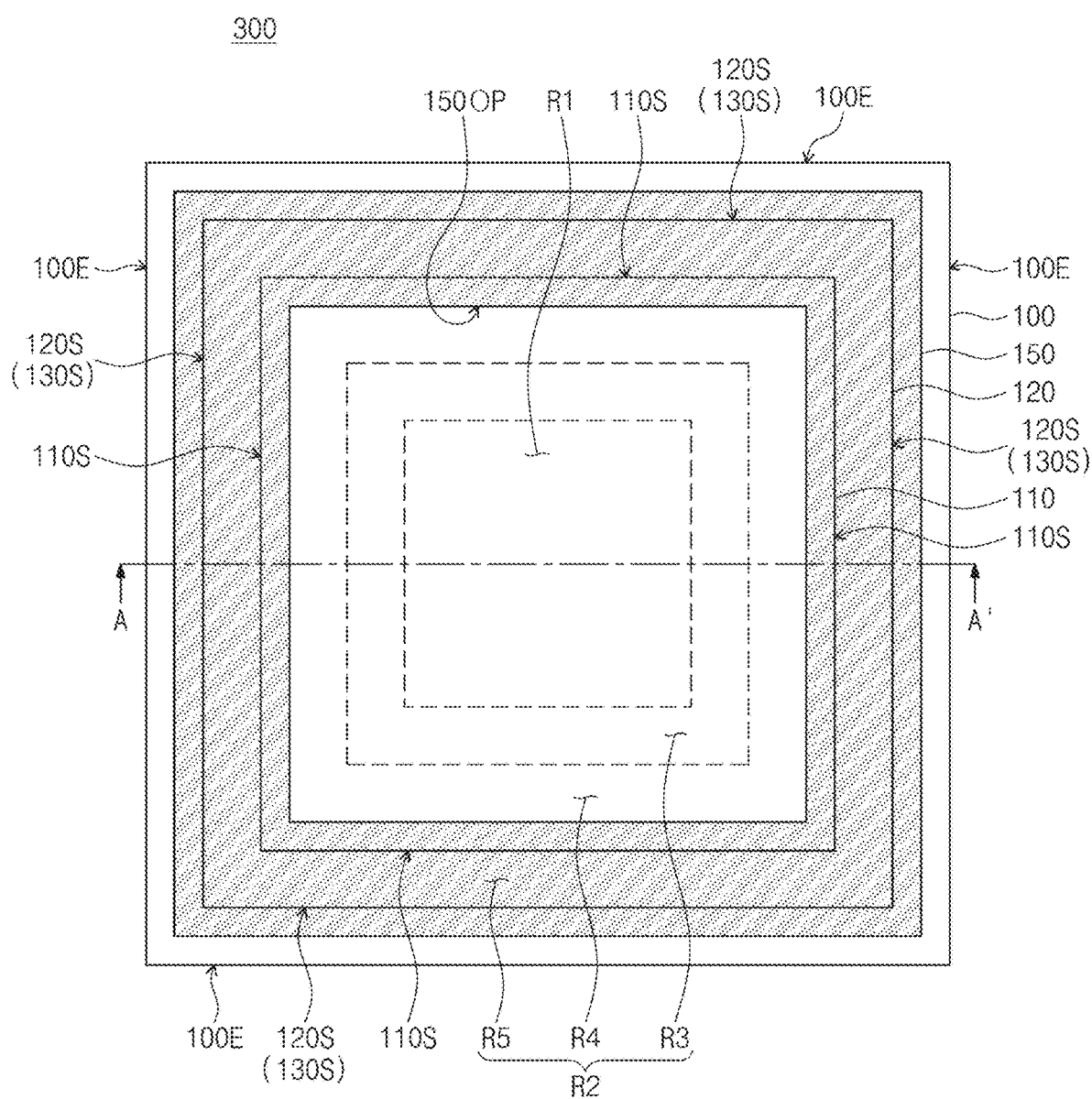
FIG. 1 illustrates a plan view showing a photomask according to some example embodiments of the present inventive concepts.
Figure 2:
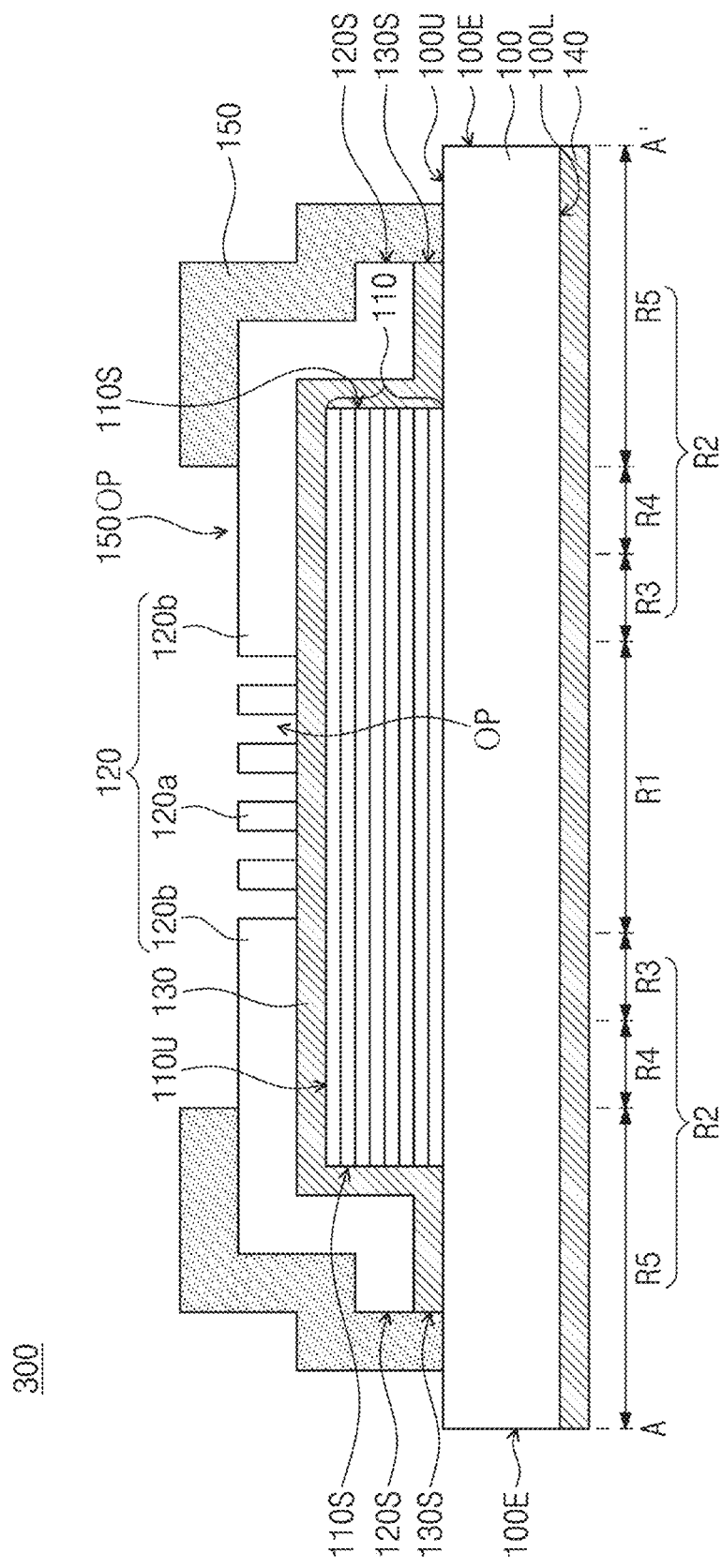
FIG. 2 illustrates a cross-sectional view taken along line A-A' of FIG. 1.

FIG. 1 illustrates a plan view showing a photomask according to some example embodiments of the present inventive concepts. FIG. 2 illustrates a cross-sectional view taken along line A-A' of FIG. 1.

Referring to FIGS. 1 and 2, a photomask 300 may include a reflection layer 110 disposed on a substrate 100. The substrate 100 may include a material whose coefficient of thermal expansion is low. For example, the substrate 100 may include glass and/or silicon (Si). The substrate 100 may include a pattern region R1, on which are disposed patterns to be transferred to a wafer, and/or a peripheral region R2 around the pattern region R1. The peripheral region R2 may include a light-shield region R3 adjacent to the pattern region R1, an outer region R5 adjacent to an edge 100E of the substrate 100, and/or a mark region R4 between the light-shield region R3 and the outer region R5. The substrate 100 may have a portion, which corresponds to the mark region R4, on which is disposed at least one key for alignment with an exposure apparatus and/or is disposed at least one mark for identification of the photomask 300. The substrate 100 may have a first surface 100U and a second surface 100L facing each other, and the reflection layer 110 may be disposed on the first surface 100U of the substrate 100.

The reflection layer 110 may be disposed on the pattern region R1 of the substrate 100 and may extend onto the peripheral region R2 of the substrate 100. The reflection layer 110 may cover the light-shield region R3 and/or the mark region R4 of the substrate 100, and may extend onto the outer region R5. The reflection layer 110 may have an outermost lateral surface 110S close to the edge 100E of the substrate 100 and indented from the edge 100E of the substrate 100.

The reflection layer 110 may reflect light (e.g., extreme ultraviolet ray) incident thereon. The reflection layer 110 may include a Bragg reflector. For example, the reflection layer 110 may include a multi-layered structure in which high-refractive layers and low-refractive layers are alternately and repeatedly stacked. One of the high-refractive layers may be interposed between a pair of the low-refractive layers adjacent to each other, and one of the low-refractive layers may be interposed between a pair of the high-refractive layers adjacent to each other. For example, the high-refractive layers and the low-refractive layers may be stacked about 40 times to about 60 times. For example, the high-refractive layers may include silicon (Si), and/or the low-refractive layers may include molybdenum (Mo). In some example embodiments, a lowermost one of the low-refractive layers may be disposed at a lowermost portion of the reflection layer 110, and an uppermost one of the high-refractive layers may be disposed at an uppermost portion of the reflection layer 110.

An absorption structure 120 may be disposed on the reflection layer 110, and a capping layer 130 may be disposed between the reflection layer 110 and the absorption structure 120. The capping layer 130 may reduce or prevent the reflection layer 110 from damage and surface oxidation. The capping layer 130 may include metal, for example, ruthenium (Ru). In some example embodiments, the capping layer 130 may cover a top surface 110U of the reflection layer 110 and/or the outermost lateral surface 110S of the reflection layer 110. The capping layer 130 may extend from the outermost lateral surface 110S of the reflection layer 110 toward the edge 100E of the substrate 100 and then onto the first surface 100U of the substrate 100. In some example embodiments, no capping layer 130 may be provided.

The absorption structure 120 may include absorption patterns 120a disposed on the pattern region R1 and/or an absorption layer 120b disposed on the peripheral region R2. First openings OP may be positioned between the absorption patterns 120a and between the absorption layer 120b and at least one of the absorption patterns 120a, while exposing the capping layer 130. In some example embodiments, no capping layer 130 may be provided, and in this case, the first openings OP may expose the top surface 110U of the reflection layer 110. The absorption patterns 120a may be disposed on the reflection layer 110 on the pattern region R1. The absorption layer 120b may be disposed on the reflection layer 110 on the light-shield region R3 and/or the mark region R4, and may extend onto the outer region R5. On the outer region R5, the absorption layer 120b may extend toward the substrate 100 along the outermost lateral surface 110S of the reflection layer 110, and may extend from the outermost lateral surface 110S of the reflection layer 110 toward the edge 100E of the substrate 100 and then onto the first surface 100U of the substrate 100. The capping layer 130 may be interposed between the reflection layer 110 and the absorption patterns 120a, and may extend between the absorption layer 120b and the reflection layer 110. On the outer region R5, the capping layer 130 may be interposed between the absorption layer 120b and the outermost lateral surface 110S of the reflection layer 110, and may extend between the absorption layer 120b and the first surface 100U of the substrate 100. The capping layer 130 may have an outermost lateral surface 130S close to the edge 100E of the substrate 100 and indented from the edge 100E of the substrate 100, and/or the absorption layer 120b may have an outermost lateral surface 120S close to the edge 100E of the substrate 100 and indented from the edge 100E of the substrate 100. For example, the outermost lateral surface 130S of the capping layer 130 may be aligned with the outermost lateral surface 120S of the absorption layer 120b. The outermost lateral surface 120S of the absorption layer 120b may also be called an outermost lateral surface of the absorption structure 120.

The absorption structure 120 may include a material that absorbs light (e.g., extreme ultraviolet ray) incident thereon. For example, the absorption structure 120 may include TaN, TaHf, TaHfN, TaBSi, TaBSiN, TaB, TaBN, TaSi, TaSiN, TaGe, TaGeN, TaZr, TaZrN, or a combination thereof. The reflection layer 110 may reflect light (e.g., extreme ultraviolet ray) incident through the first openings OP and/or the capping layer 130, and the light reflected from the reflection layer 110 may travel toward a wafer after passing through the capping layer 130 and the first openings OP. Patterns to be transferred to the wafer may have their shapes corresponding to those of the first openings OP.

A dielectric pattern 150 may be disposed on the absorption structure 120 on the peripheral region R2, and may expose the absorption structure 120 on the pattern region R1. The dielectric pattern 150 may be disposed on the absorption structure 120 on the outer region R5, and may expose the absorption structure 120 on the light-shield region R3 and the mark region R4. When viewed in plan, the dielectric pattern 150 may have a ring shape extending along the edge 100E of the substrate 100. The dielectric pattern 150 may have a second opening 150OP that exposes the absorption structure 120 on the pattern region R1, the light-shield region R3, and the mark region R4.

The dielectric pattern 150 may cover the absorption structure 120 on the outer region R5. On the outer region R5, the dielectric pattern 150 may extend along the absorption structure 120, and may cover the outermost lateral surface 120S of the absorption structure 120. The dielectric pattern 150 may extend from the outermost lateral surface 120S of the absorption structure 120 toward the substrate 100, and may cover the outermost lateral surface 130S of the capping layer 130. The dielectric pattern 150 may be in contact with the first surface 100U of the substrate 100. The absorption structure 120 and/or the capping layer 130 may be interposed between the dielectric pattern 150 and the outermost lateral surface 110S of the reflection layer 110.

The dielectric pattern 150 may expose the absorption patterns 120a. The dielectric pattern 150 may expose a portion of the absorption layer 120b, which portion is far away from, or distal to, the edge 100E of the substrate 100, and may cover a remaining portion of the absorption layer 120b, which remaining portion is close, or proximal, to the edge 100E of the substrate 100. For example, the dielectric pattern 150 may expose a portion of the absorption layer 120b, which portion is on the light-shield region R3 and the mark region R4, and may be disposed on a remaining portion of the absorption layer 120b, which remaining portion is on the outer region R5. The second opening 150OP may expose the absorption patterns 120a and/or the portion of the absorption layer 120b, which portion is on the light-shield region R3 and the mark region R4. The dielectric pattern 150 may cover the remaining portion of the absorption layer 120b, which remaining portion is on the outer region R5. On the outer region R5, the dielectric pattern 150 may extend along the absorption layer 120b, and may cover the outermost lateral surface 120S of the absorption layer 120b. The dielectric pattern 150 may extend from the outermost lateral surface 120S of the absorption layer 120b toward the substrate 100, and may cover the outermost lateral surface 130S of the capping layer 130. The dielectric pattern 150 may be in contact with the first surface 100U of the substrate 100. The absorption structure 120 and/or the capping layer 130 may be interposed between the dielectric pattern 150 and the outermost lateral surface 110S of the reflection layer 110.

The dielectric pattern 150 may include an electrically insulating material. For example, the dielectric pattern 150 may include one or more of a silicon oxide layer, a silicon nitride layer, a silicon oxynitride layer, or a combination thereof. For another example, the dielectric pattern 150 may include one or more of an oxide layer, a nitride layer, and an oxynitride layer that contain at least one of elements included in the absorption structure 120. For another example, the dielectric pattern 150 may include a metal oxide layer, for example, a chromium oxide layer.

A lower capping layer 140 may be disposed on the second surface 100L of the substrate 100. The lower capping layer 140 may be spaced apart, across the substrate 100, from the reflection layer 110, the capping layer 130, the absorption structure 120, and/or the dielectric pattern 150. The lower capping layer 140 may include a conductive material.

The photomask 300 according to some example embodiments of the present inventive concepts may be used for an extreme ultraviolet (EUV) exposure process. The EUV exposure process may be performed under vacuum state, and an electrostatic chuck may be utilized to rigidly place the photomask 300 under vacuum state. The lower capping layer 140 may cause the photomask 300 to fix on the electrostatic chuck.

When one or more of the reflection layer 110, the capping layer 130, and/or the absorption structure 120 are externally exposed on the outer region R5 of the substrate 100, an electric field produced from the electrostatic chuck and/or EUV exposure may accumulate charges in the one or more of the reflection layer 110, the capping layer 130, and/or the absorption structure 120. In this case, the accumulated charges may generate an electric arc on the outer region R5 of the substrate 100, and as a result, particles may be transferred to the pattern region R1 of the substrate 100 during the exposure process. The particles transferred to the pattern region R1 may produce pattern defects in the photomask 300.

According to the present inventive concepts, the substrate 100 may be provided on its outer region R5 with the dielectric pattern 150 covering the absorption structure 120 and/or the capping layer 130. The absorption structure 120 and/or the capping layer 130 may be interposed between the dielectric pattern 150 and the outermost lateral surface 110S of the reflection layer 110. In this configuration, the dielectric pattern 150 may reduce or prevent the reflection layer 110, the absorption structure 120, and/or the capping layer 130 from being externally exposed on the outer region R5 of the substrate 100. Accordingly, an electric arc may be suppressed on the outer region R5 of the substrate 100, and the occurrence of particles caused by the electric arc may be reduced or minimized. Consequently, it may be possible to reduce or minimize the occurrence of pattern defects in the photomask 300.

Figure 3:
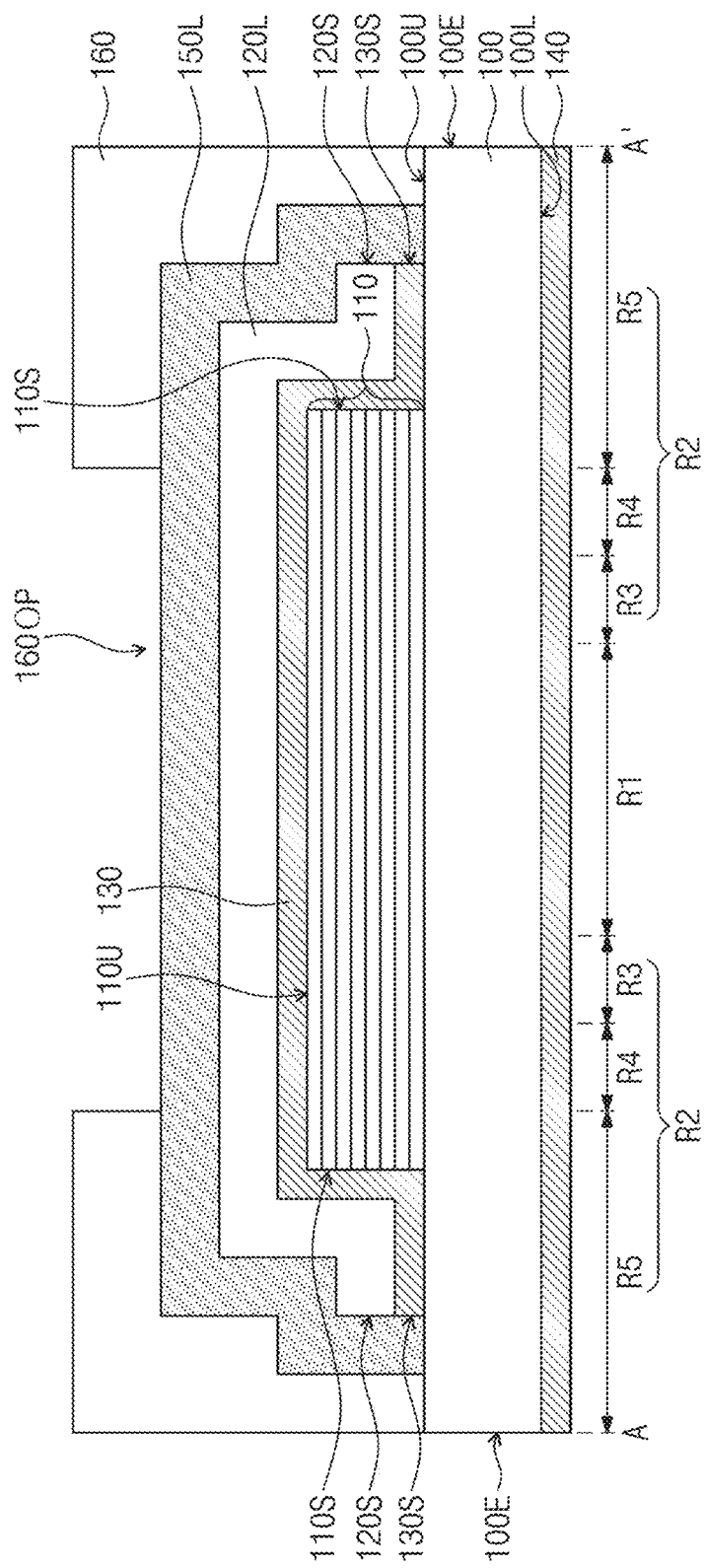
FIGS. 3 to 5 illustrate cross-sectional views taken along line A-A' of FIG. 1, showing a method of fabricating a photomask according to some example embodiments of the present inventive concepts.
Figure 4:
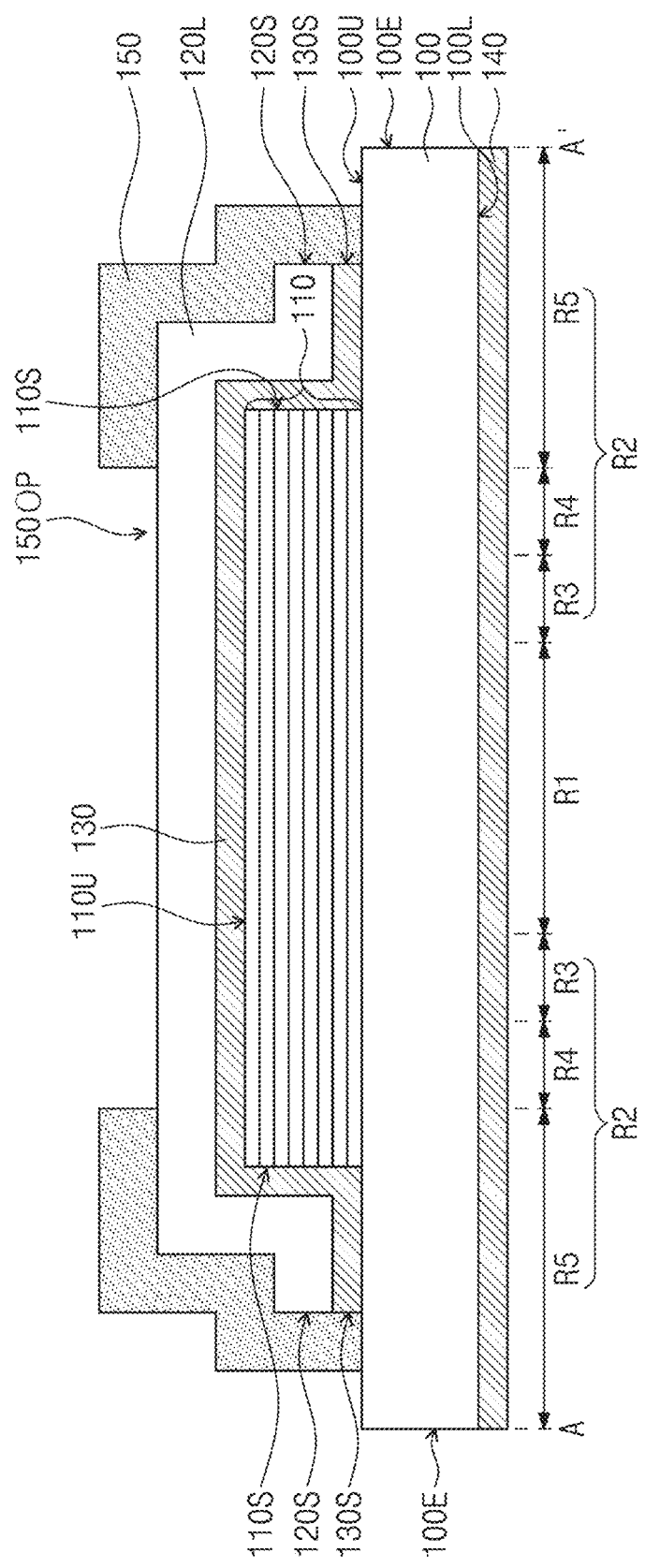
Figure 5:
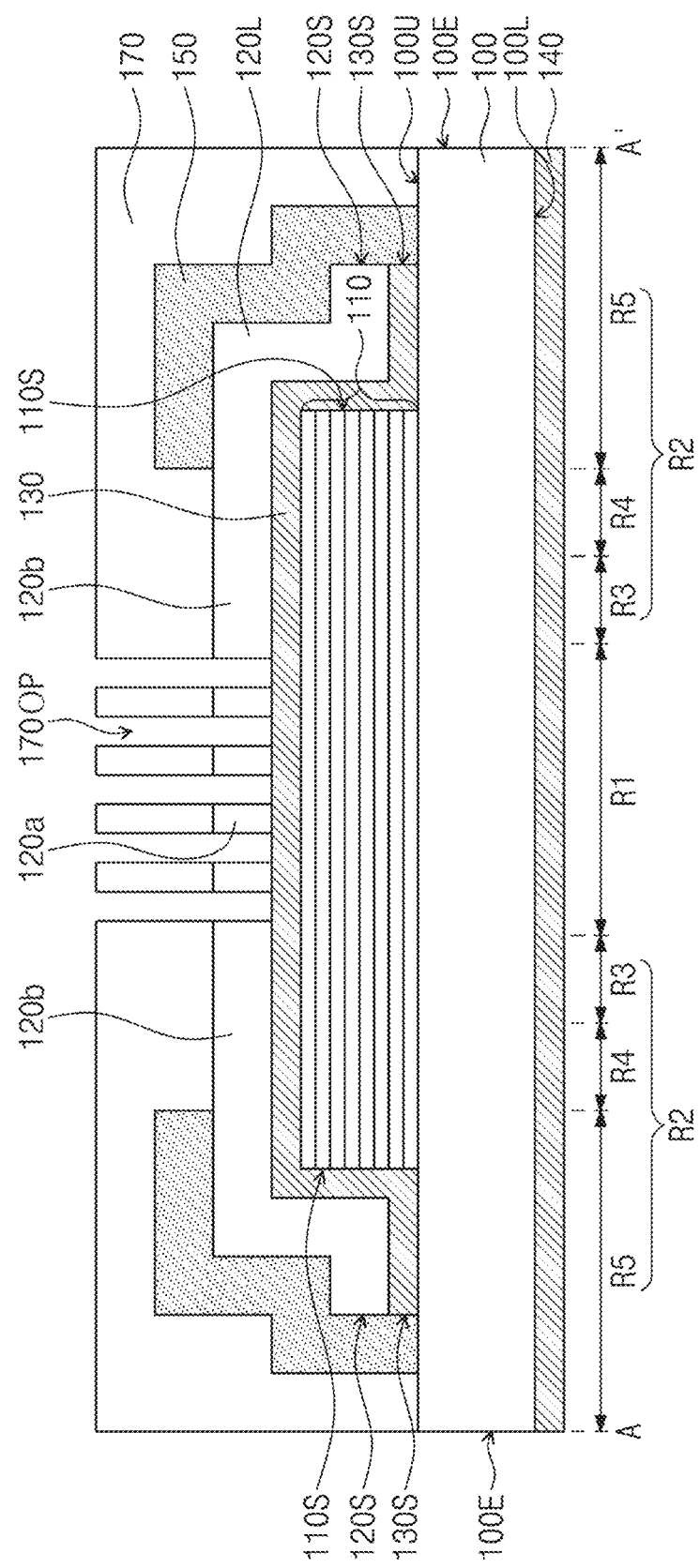

FIGS. 3 to 5 illustrate cross-sectional views taken along line A-A' of FIG. 1, showing a method of fabricating a photomask according to some example embodiments of the present inventive concepts. The same technical features as those of the photomask discussed with reference to FIGS. 1 and 2 may be omitted for brevity of description.

Referring to FIGS. 1 and 3, a substrate 100 may be provided that includes a pattern region R1 and/or a peripheral region R2. The peripheral region R2 may include a light-shield region R3 adjacent to the pattern region R1, an outer region R5 adjacent to an edge 100E of the substrate 100, and/or a mark region R4 between the light-shield region R3 and the outer region R5. The substrate 100 may have a first surface 100U and a second surface 100L facing each other, and a lower capping layer 140 may be formed on the second surface 100L of the substrate 100. The lower capping layer 140 may be formed using, for example, a sputtering deposition process.

A reflection layer 110 may be formed on the first surface 100U of the substrate 100. The reflection layer 110 may be formed by alternately and repeatedly depositing high-refractive layers and low-refractive layers. The high-refractive layers and the low-refractive layers may be deposited about 40 times to about 60 times. The reflection layer 110 may be formed by performing a sputtering deposition process that uses a target including a high-refractive material and a target including a low-refractive material. The reflection layer 110 may be formed to have an outermost lateral surface 110S close to the edge 100E of the substrate 100 and indented from to the edge 100E of the substrate 100.

A capping layer 130 may be formed on the reflection layer 110. The capping layer 130 may be formed using, for example, a chemical vapor deposition (CVD) process, a physical vapor deposition (PVD) process, an atomic layer deposition (ALD) process, a sputtering deposition process or a combination thereof. The capping layer 130 may be formed to cover a top surface 110U of the reflection layer 110 and/or the outermost lateral surface 110S of the reflection layer 110, and to extend onto the first surface 100U of the substrate 100.

A preliminary absorption layer 120L may be formed on the capping layer 130. The preliminary absorption layer 120L may be formed using, for example, a sputtering deposition process. The preliminary absorption layer 120L may be formed to extend along the capping layer 130. The preliminary absorption layer 120L may be formed to cover the top surface 110U and/or the outermost lateral surface 110S of the reflection layer 110, and to extend onto the first surface 100U of the substrate 100. The capping layer 130 may be interposed between the preliminary absorption layer 120L and the top surface 110U of the reflection layer 110, between the preliminary absorption layer 120L and the outermost lateral surface 110S of the reflection layer 110, and between the preliminary absorption layer 120L and the first surface 100U of the substrate 100.

The capping layer 130 may be formed to have an outermost lateral surface 130S close to the edge 100E of the substrate 100 and indented from the edge 100E of the substrate 100, and likewise, the preliminary absorption layer 120L may be formed to have an outermost lateral surface 120S close to the edge 100E of the substrate 100 and indented from the edge 100E of the substrate 100. In some example embodiments, the outermost lateral surface 130S of the capping layer 130 may be aligned with the outermost lateral surface 120S of the preliminary absorption layer 120L.

A dielectric layer 150L may be formed on the preliminary absorption layer 120L. The dielectric layer 150L may be formed using, for example, a chemical vapor deposition (CVD) process, a physical vapor deposition (PVD) process, an atomic layer deposition (ALD) process, a sputtering deposition process, or a combination thereof. The dielectric layer 150L may be formed to cover the preliminary absorption layer 120L and/or the capping layer 130. The dielectric layer 150L may extend along the preliminary absorption layer 120L, covering the outermost lateral surface 120S of the preliminary absorption layer 120L and/or the outermost lateral surface 130S of the capping layer 130. On the outer region R5, the dielectric layer 150L may be formed to contact the first surface 100U of the substrate 100. The dielectric layer 150L may include, for example, one or more of a silicon oxide layer, a silicon nitride layer, and/or a silicon oxynitride layer.

A first mask pattern 160 may be formed on the dielectric layer 150L. The first mask pattern 160 may be, for example, a photoresist pattern. The first mask pattern 160 may be formed on the outer region R5 of the substrate 100, and when viewed in plan, may have a ring shape extending along the edge 100E of the substrate 100. The first mask pattern 160 may have a first mask opening 160OP, which may expose the dielectric layer 150L on the pattern region R1, the light-shield region R3, and/or the mark region R4.

Referring to FIGS. 1 and 4, the first mask pattern 160 may be used as an etching mask to etch the dielectric layer 150L to form a dielectric pattern 150 on the preliminary absorption layer 120L. The dielectric pattern 150 may be formed on the outer region R5 of the substrate 100, and when viewed in plan, may have a ring shape extending along the edge 100E of the substrate 100. The dielectric pattern 150 may expose the preliminary absorption layer 120L on the pattern region R1, the light-shield region R3, and/or the mark region R4. After the dielectric pattern 150 is formed, the first mask pattern 160 may be removed. The first mask pattern 160 may be removed by, for example, an ashing process and/or a strip process.

Referring to FIGS. 1 and 5, a second mask pattern 170 may be formed on the dielectric pattern 150 and/or the preliminary absorption layer 120L. The second mask pattern 170 may be, for example, a photoresist pattern. The second mask pattern 170 may have a second mask opening 170OP, which may expose the preliminary absorption layer 120L on the pattern region R1.

The second mask pattern 170 may be used as an etching mask to etch the preliminary absorption layer 120L to form absorption patterns 120a and/or an absorption layer 120b. The absorption patterns 120a may be disposed on the pattern region R1 to define shapes of patterns to be transferred to a wafer. The absorption layer 120b may be disposed on the reflection layer 110 on the light-shield region R3 and/or the mark region R4, and/or may extend onto the outer region R5. The absorption layer 120b may have an outermost lateral surface 120S close to the edge 100E of the substrate 100 and indented from the edge 100E of the substrate 100. Afterwards, the second mask pattern 170 may be removed. The second mask pattern 170 may be removed by, for example, an ashing process and/or a strip process. The aforementioned processes may fabricate the photomask 300 discussed with reference to FIGS. 1 and 2.

Figure 6:
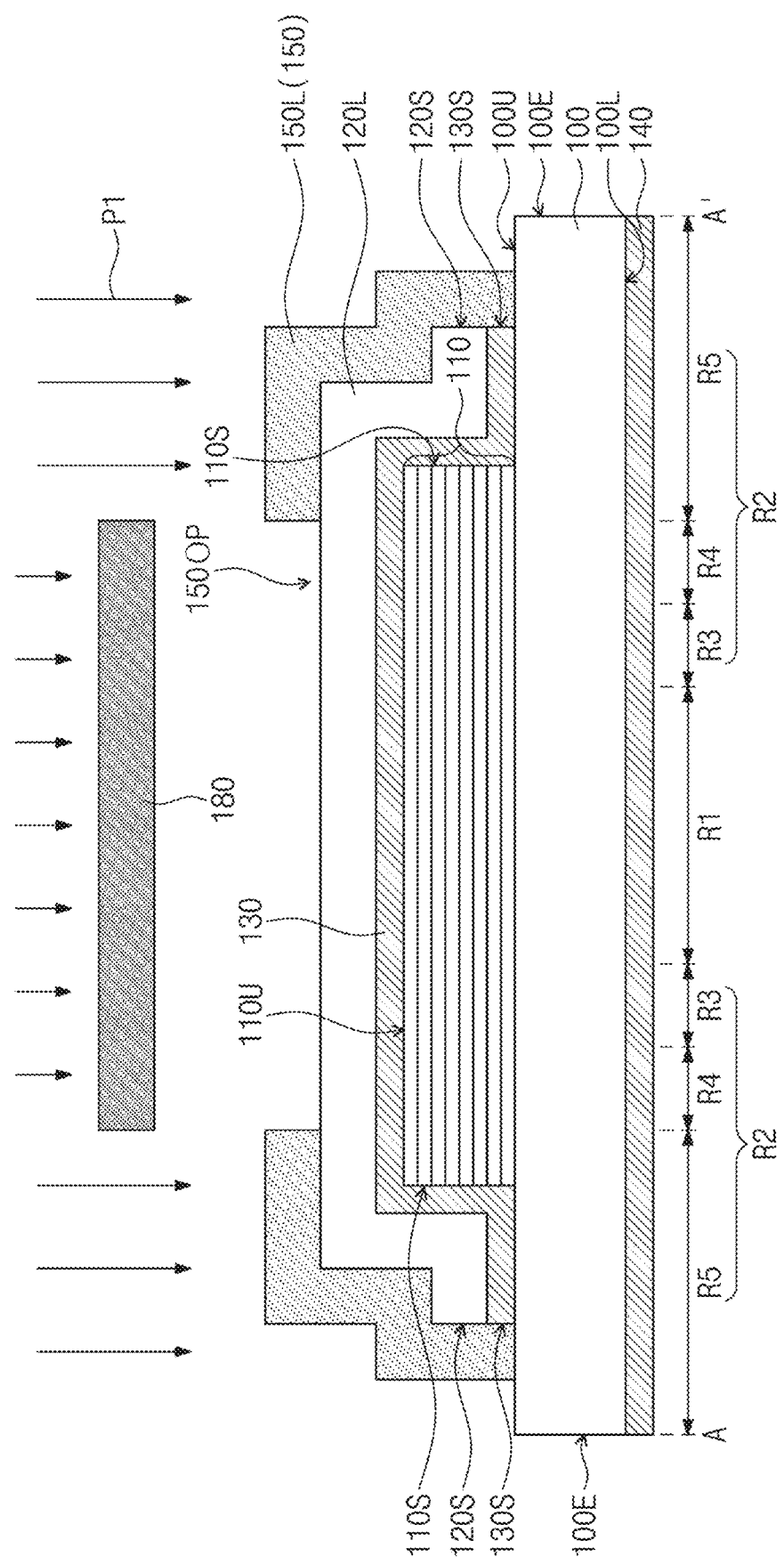
FIG. 6 illustrates a cross-sectional view taken along line A-A' of FIG. 1, showing a method of fabricating a photomask according to some example embodiments of the present inventive concepts.

FIG. 6 illustrates a cross-sectional view taken along line A-A' of FIG. 1, showing a method of fabricating a photomask according to some example embodiments of the present inventive concepts. For brevity of description, the following will mainly explain differences from the photomask fabrication method discussed with reference to FIGS. 3 to 5.

As discussed with reference to FIGS. 1 and 3, the reflection layer 110, the capping layer 130, and/or the preliminary absorption layer 120L may be sequentially formed on the first surface 100U of the substrate 100, and/or the lower capping layer 140 may be formed on the second surface 100L of the substrate 100.

Referring to FIG. 6, a dielectric layer 150L may be formed on the preliminary absorption layer 120L. In some example embodiments, the dielectric layer 150L may be locally formed on the preliminary absorption layer 120L on the outer region R5. The dielectric layer 150L may be locally formed on the outer region R5 by performing one of physical vapor deposition (PVD) and sputtering deposition processes that use a blocking shield 180. For example, the blocking shield 180 may be provided on the preliminary absorption layer 120L. The blocking shield 180 may be provided to vertically overlap the pattern region R1, the light-shield region R3, and/or the mark region R4 of the substrate 100 and to expose the outer region R5 of the substrate 100. A deposition process may be performed to form the dielectric layer 150L in a state that the blocking shield 180 is provided on the preliminary absorption layer 120L. In this case, the blocking shield 180 may block deposition sources P1 of the deposition process, and thus the deposition sources P1 may not be deposited on the pattern region R1, the light-shield region R3, and/or the mark region R4, but may be locally deposited on the preliminary absorption layer 120L on the outer region R5 exposed by the blocking shield 180. Therefore, the dielectric layer 150L may be locally formed on the preliminary absorption layer 120L on the outer region R5. A dielectric pattern 150 may refer to the dielectric layer 150L locally formed on the outer region R5. In some example embodiments, the dielectric pattern 150 may include, for example, one or more of a silicon oxide layer, a silicon nitride layer, a silicon oxynitride layer, or a combination thereof. Subsequent processes may be the same as those discussed with reference to FIGS. 1 and 5.

Figure 7:
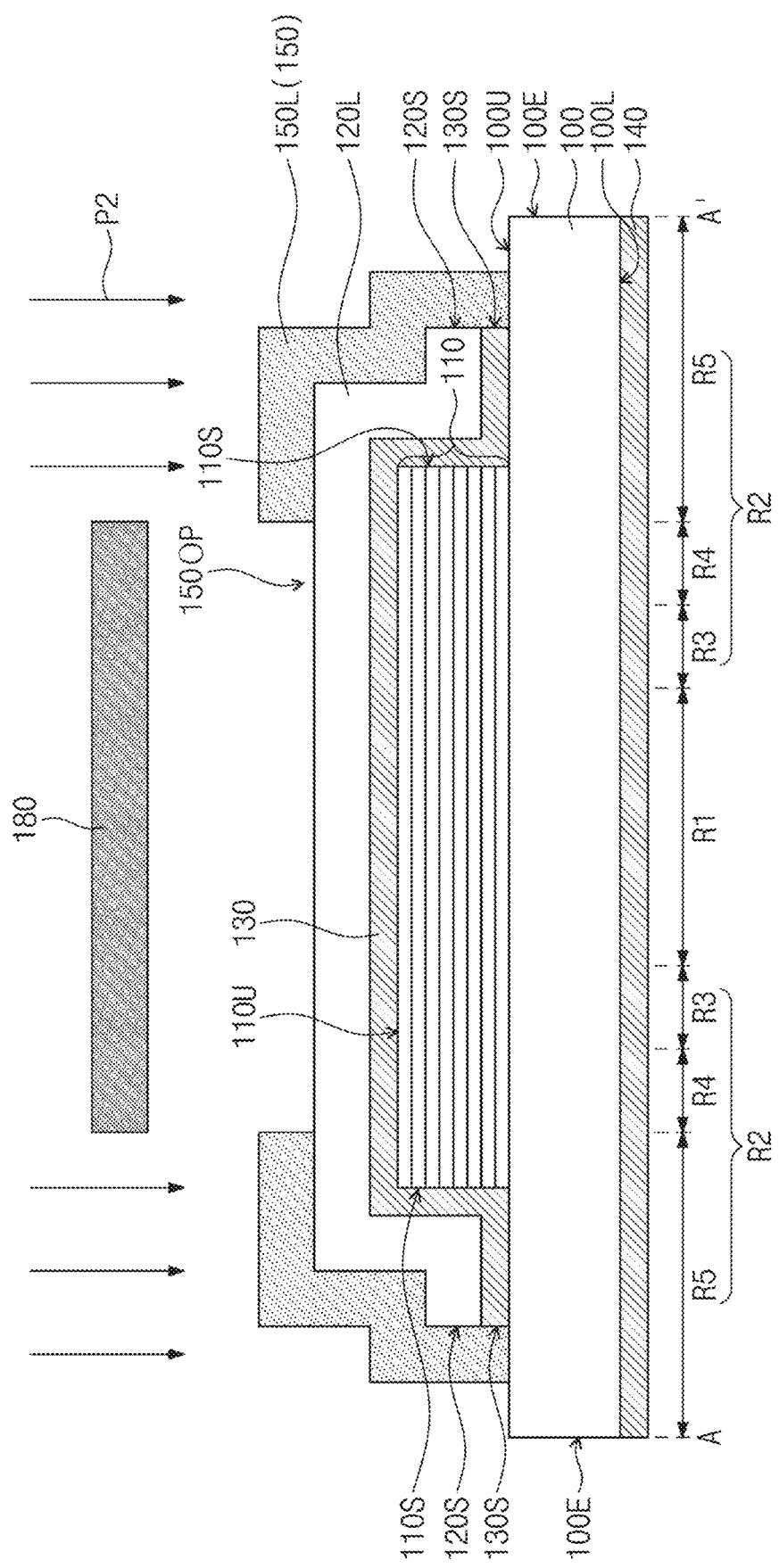
FIG. 7 illustrates a cross-sectional view taken along line A-A' of FIG. 1, showing a method of fabricating a photomask according to some example embodiments of the present inventive concepts.

FIG. 7 illustrates a cross-sectional view taken along line A-A' of FIG. 1, showing a method of fabricating a photomask according to some example embodiments of the present inventive concepts. For brevity of description, the following will mainly explain differences from the photomask fabrication method discussed with reference to FIGS. 3 to 5.

As discussed with reference to FIGS. 1 and 3, the reflection layer 110, the capping layer 130, and/or the preliminary absorption layer 120L may be sequentially formed on the first surface 100U of the substrate 100, and the lower capping layer 140 may be formed on the second surface 100L of the substrate 100.

Referring to FIG. 7, a dielectric layer 150L may be formed on the preliminary absorption layer 120L. In some example embodiments, the dielectric layer 150L may be locally formed on the preliminary absorption layer 120L on the outer region R5. The formation of the dielectric layer 150L may include performing a thermal oxidation process (e.g., a laser annealing process and/or an ultraviolet (UV) bake process) to locally form a native oxide layer on the preliminary absorption layer 120L on the outer region R5. Alternatively, the formation of the dielectric layer 150L may include performing a plasma treatment process using a dielectric source (e.g., oxygen and/or nitrogen) to locally form the dielectric layer 150L on the preliminary absorption layer 120L on the outer region R5. Even in a state that the blocking shield 180 is provided on the preliminary absorption layer 120L or that the blocking shield 180 is not provided, the discussed processes P2 (e.g., the thermal oxidation process and/or the plasma treatment process) may be performed to locally form the dielectric layer 150L on the outer region R5. Due to the processes P2, the dielectric layer 150L may be locally formed on the preliminary absorption layer 120L on the outer region R5, and may be called a dielectric pattern 150. In some example embodiments, the dielectric pattern 150 may include, for example, one or more of an oxide layer, a nitride layer, and an oxynitride layer that contain at least one of elements included in the preliminary absorption layer 120L. Subsequent processes may be the same as those discussed with reference to FIGS. 1 and 5.

Figure 8:
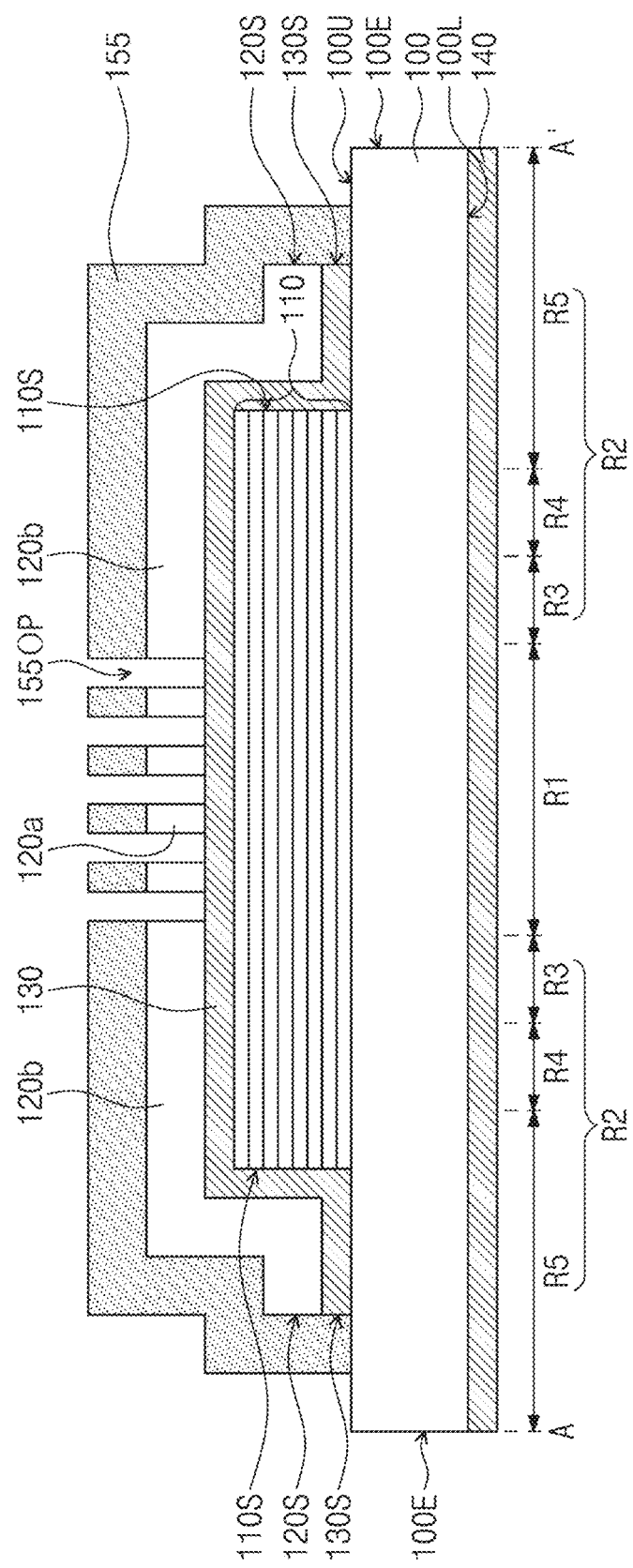
FIGS. 8 to 10 illustrate cross-sectional views taken along line A-A' of FIG. 1, showing a method of fabricating a photomask according to some example embodiments of the present inventive concepts.
Figure 9:
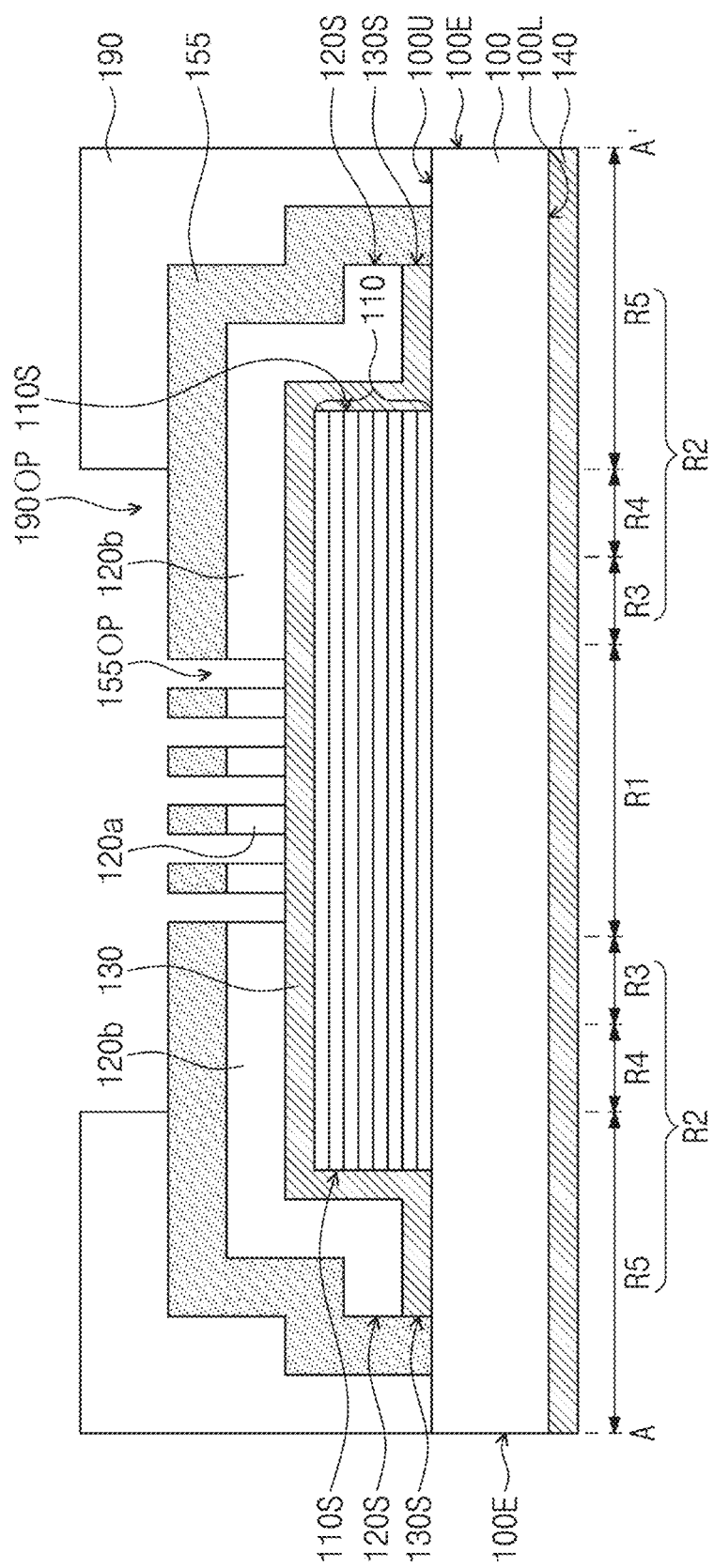
Figure 10:
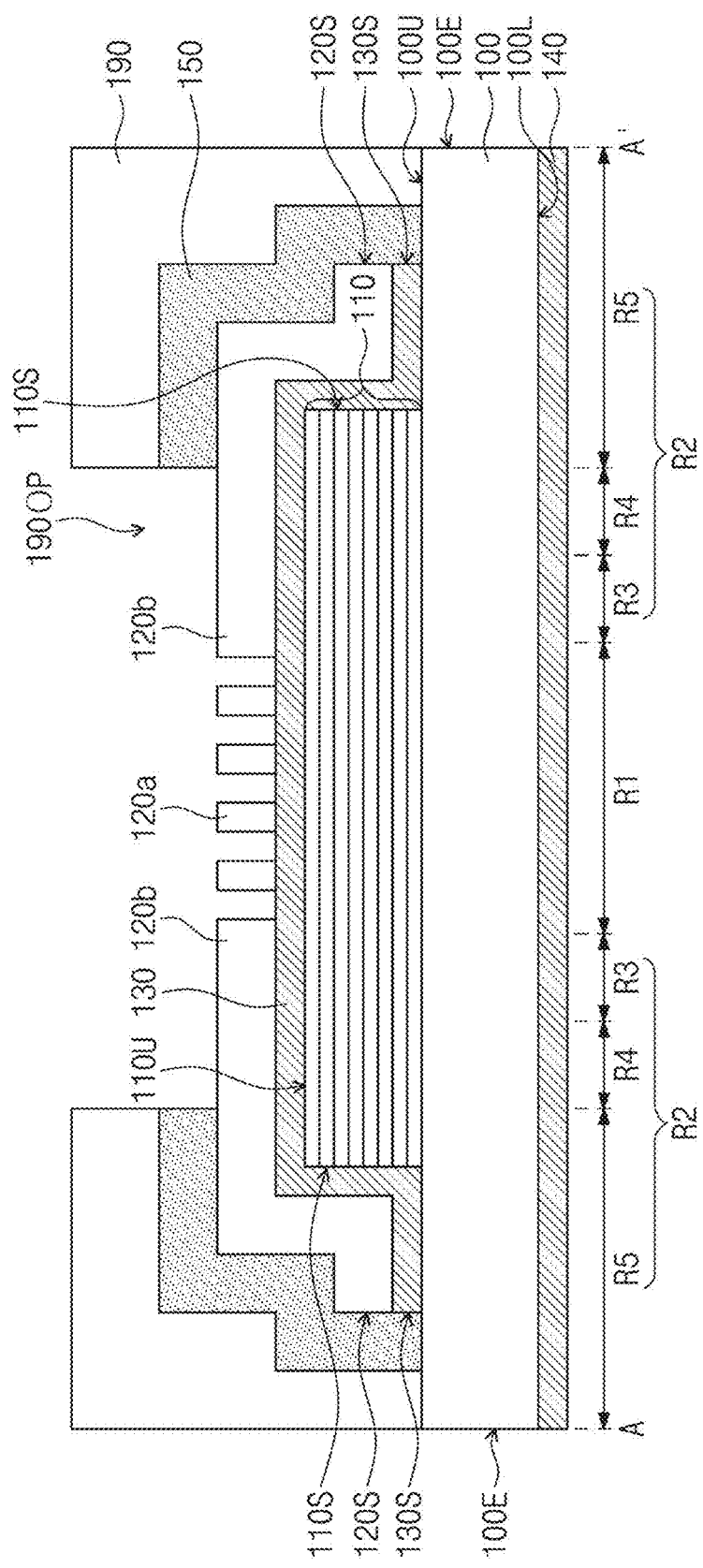

FIGS. 8 to 10 illustrate cross-sectional views taken along line A-A' of FIG. 1, showing a method of fabricating a photomask according to some example embodiments of the present inventive concepts. For brevity of description, the following will mainly explain differences from the photomask fabrication method discussed with reference to FIGS. 3 to 5.

As discussed with reference to FIGS. 1 and 3, the reflection layer 110, the capping layer 130, and/or the preliminary absorption layer 120L may be sequentially formed on the first surface 100U of the substrate 100, and/or the lower capping layer 140 may be formed on the second surface 100L of the substrate 100.

Referring to FIG. 8, a dielectric mask pattern 155 may be formed on the preliminary absorption layer 120L. The dielectric mask pattern 155 may have a dielectric mask opening 155OP, which may expose the preliminary absorption layer 120L on the pattern region R1. The dielectric mask pattern 155 may include a metal oxide layer, for example, a chromium oxide layer. The dielectric mask pattern 155 may be used as an etching mask to etch the preliminary absorption layer 120L to form absorption patterns 120a and/or an absorption layer 120b.

Referring to FIG. 9, after the formation of the absorption patterns 120a and/or the absorption layer 120b, an upper mask pattern 190 may be formed on the dielectric mask pattern 155. The upper mask pattern 190 may be, for example, a photoresist pattern. The upper mask pattern 190 may be formed on the outer region R5 of the substrate 100, and when viewed in plan, may have a ring shape extending along the edge 100E of the substrate 100. The upper mask pattern 190 may have an upper mask opening 190OP, which may expose the dielectric mask pattern 155 on the pattern region R1, the light-shield region R3, and/or the mark region R4.

Referring to FIG. 10, the upper mask pattern 190 may be used as an etching mask to etch the dielectric mask pattern 155 to form a dielectric pattern 150 on the absorption layer 120b. The dielectric pattern 150 may be formed on the outer region R5 of the substrate 100, and when viewed in plan, may have a ring shape extending along the edge 100E of the substrate 100. The dielectric pattern 150 may expose the absorption patterns 120a on the pattern region R1 and/or a portion of the absorption layer 120b, which portion is on the light-shield region R3 and the mark region R4, and may cover a remaining portion of the absorption layer 120b, which remaining portion is on the outer region R5. In some example embodiments, the dielectric pattern 150 may include a metal oxide layer, for example, a chromium oxide layer. Afterwards, the upper mask pattern 190 may be removed. The upper mask pattern 190 may be removed by, for example, an ashing process and/or a strip process. The aforementioned processes may fabricate the photomask 300 discussed with reference to FIGS. 1 and 2.

Figure 11:
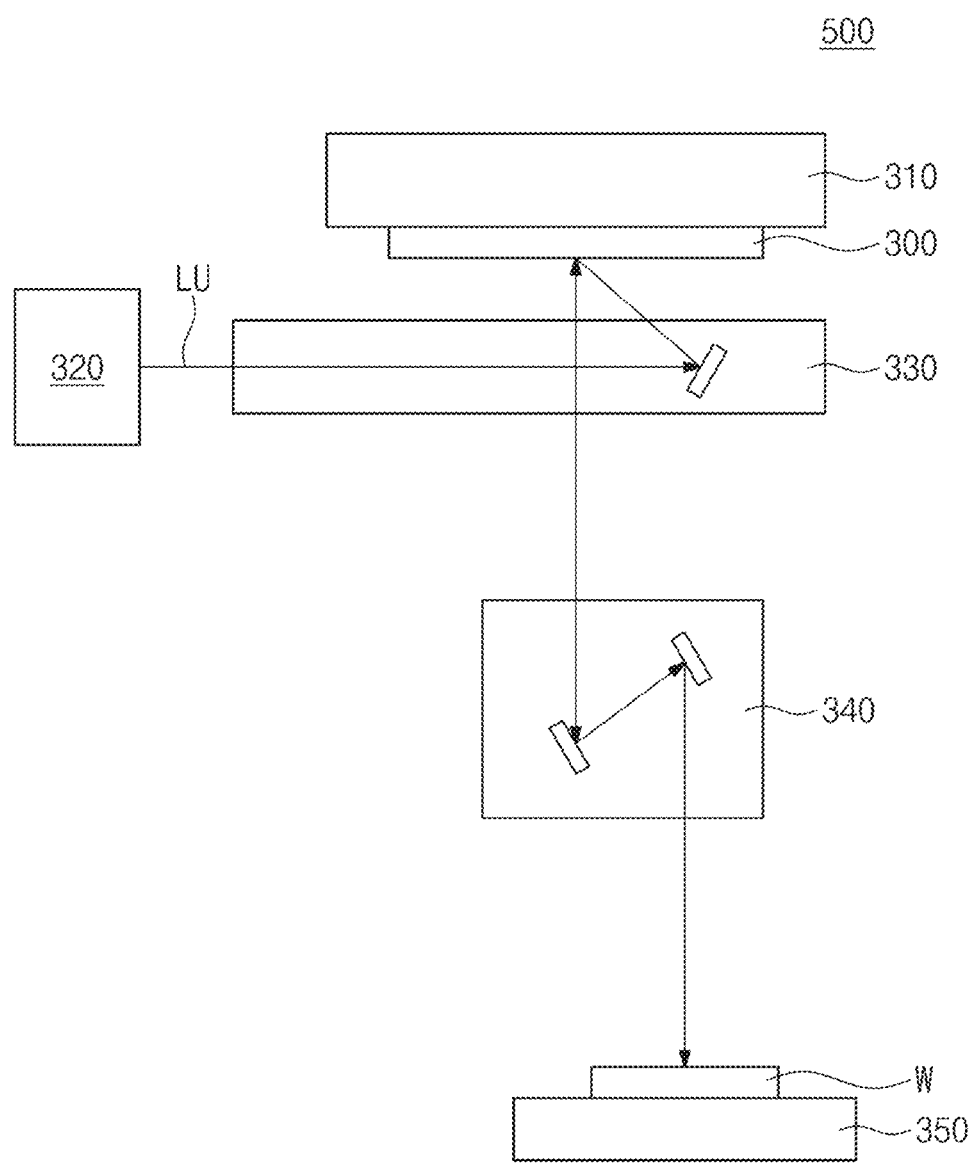
FIG. 11 illustrates a schematic diagram showing an exposure apparatus that uses a photomask according to some example embodiments of the present inventive concepts.

FIG. 11 illustrates a schematic diagram showing an exposure apparatus that uses a photomask according to some example embodiments of the present inventive concepts.

Referring to FIG. 11, an exposure apparatus 500 may include an extreme ultraviolet (EUV) generator 320, an illumination system 330, a projection optical system 340, a mask stage 310, and/or a wafer stage 350. The mask stage 310 may include an electrostatic chuck (ESC) on which a photomask 300 is loaded and fixed. The photomask 300 may include the same components as those of the photomask 300 discussed with reference to FIGS. 1 and 2 according to some example embodiments of the present inventive concepts. In this case, the photomask 300 may be provided allowing the second surface 100L of the substrate 100 to face the mask stage 310, and the lower capping layer 140 may cause the photomask 300 to rigidly place on the electrostatic chuck. The wafer stage 350 may load a wafer W on its one side, and may support the wafer W during an exposure process.

The EUV generator 320 may provide the illumination system 330 with an extreme ultraviolet ray LU generated therefrom, and the illumination system 330 may transfer the extreme ultraviolet ray LU to the photomask 300. The photomask 300 may include mask patterns used to print an integrated circuit layout on the wafer W. The mask patterns may be formed by the absorption patterns 120a and the first openings OP therebetween discussed with reference to FIGS. 1 and 2. A portion of the extreme ultraviolet ray LU may be absorbed into the absorption structure 120, and other portion of the extreme ultraviolet ray LU may reach the reflection layer 110 after passing through the first openings OP and the capping layer 130. The extreme ultraviolet ray LU may be reflected from the reflection layer 110, and may pass through the capping layer 130 and the first openings OP and then reflect outwardly from the photomask 300.

The extreme ultraviolet ray LU reflected from the photomask 300 may pass through the projection optical system 340 and then travel to the wafer W. The projection optical system 340 may match the mask patterns of the photomask 300 with circuit patterns of layout to be printed on the wafer W. When the wafer W is irradiated with the extreme ultraviolet ray LU that has passed through the projection optical system 340, the wafer W may be printed thereon with patterns corresponding to the mask patterns of the photomask 300.

Figure 12:
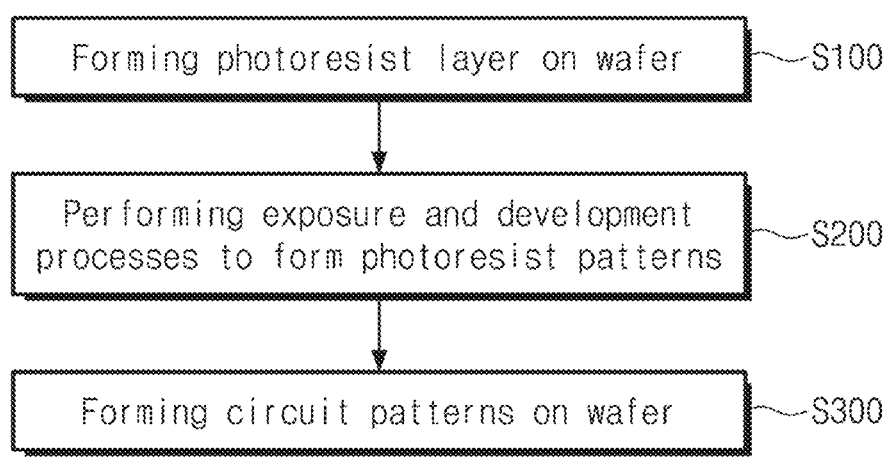
FIG. 12 illustrates a flow chart showing a method of manufacturing a semiconductor device using a photomask according to some example embodiments of the present inventive concepts.

FIG. 12 illustrates a flow chart showing a method of manufacturing a semiconductor device using a photomask according to some example embodiments of the present inventive concepts.

Referring to FIG. 12, a photoresist layer may be formed on a wafer (S100). The photoresist layer may be formed by performing, for example, a spin coating process. The photoresist layer may undergo exposure and development processes to form photoresist patterns (S200). The exposure process may be an extreme ultraviolet (EUV) exposure process in which a reflective photomask is used. The reflective photomask may be the photomask 300 discussed with reference to FIGS. 1 and 2, and the EUV exposure process may be performed using the exposure apparatus 500 discussed with reference to FIG. 11. The exposure and development processes may form the photoresist patterns on the wafer that correspond to the mask patterns (e.g., the absorption patterns 120a and/or the first openings OP) of the photomask 300. An etching process, in which the photoresist patterns are used as an etching mask, may be performed to form circuit patterns on the wafer (S300). The circuit patterns may constitute a portion of a semiconductor device to be formed on the wafer.

In some example embodiments, the photomask 300 including the dielectric pattern 150 may be used to perform an extreme ultraviolet (EUV) exposure process for manufacturing of semiconductor devices. During the EUV exposure process, the photomask 300 may be rigidly placed on the electrostatic chuck (ESC), and in this case, the dielectric pattern 150 may reduce or prevent an electric arc on an edge of the photomask 300. Therefore, the occurrence of particles due to the electric arc may be reduced or minimized, and defects of the photomask 300 caused by the particles may also be reduced or minimized. Because the EUV exposure process uses the photomask 300 in which the occurrence of defects is reduced or minimized, the wafer may have thereon circuit patterns in which the occurrence of defects is reduced or minimized. As a result, it may be possible to provide a method of manufacturing a semiconductor device, which method is capable of reducing or minimizing the occurrence of defects on the circuit patterns.

According to the present inventive concepts, a photomask may include a dielectric pattern disposed on an outer region of a substrate. The dielectric pattern may reduce or prevent an electric arc on the outer region of the substrate, and then may reduce or minimize the occurrence of particles caused by the electric arc. Accordingly, it may be possible to reduce or minimize particle-induced defects of the photomask. In addition, when an exposure process for manufacturing semiconductor devices is performed using the photomask in which the occurrence of defects is reduced or minimized, defects may be reduced, minimized, or prevented on circuit patterns to be formed on a wafer. In conclusion, a method of manufacturing a semiconductor device may be provided that is capable of reducing, minimizing, or preventing defects of the circuit patterns.

The aforementioned description provides some example embodiments for explaining the present inventive concepts. However, the present inventive concepts are not limited to the embodiments described above, and it will be understood by one of ordinary skill in the art that variations in form and detail may be made therein without departing from the spirit and essential features of the present inventive concepts.

What is claimed is:

1. A photomask, comprising:
    a substrate including a pattern region and a peripheral region around the pattern region;
    a reflection layer on the pattern region and extending onto the peripheral region;
    an absorption structure on the reflection layer; and
    a dielectric pattern on the absorption structure on the peripheral region and exposing the absorption structure on the pattern region.

2. The photomask of claim 1, wherein the peripheral region includes:
    a light-shield region adjacent to the pattern region;
    an outer region adjacent to an edge of the substrate; and
    a mark region between the light-shield region and the outer region,
    wherein the dielectric pattern exposes the absorption structure on the light-shield region and the mark region.

3. The photomask of claim 2, wherein, on the outer region, the dielectric pattern covers a lateral surface of the absorption structure and extends onto the substrate.

4. The photomask of claim 3, wherein, on the outer region, the dielectric pattern is in contact with a first surface of the substrate.

5. The photomask of claim 3, wherein, on the outer region, the absorption structure extends between the dielectric pattern and a lateral surface of the reflection layer.

6. The photomask of claim 2, wherein the absorption structure includes:
    a plurality of absorption patterns on the reflection layer on the pattern region; and
    an absorption layer covering the reflection layer on the light-shield region and the mark region and extending onto the outer region,
    wherein the dielectric pattern is on the absorption layer on the outer region.

7. The photomask of claim 6, wherein the dielectric pattern exposes the absorption patterns and a portion of the absorption layer, the portion being on the light-shield region and the mark region.

8. The photomask of claim 7, wherein, on the outer region, the dielectric pattern covers a lateral surface of the absorption layer and extends onto the substrate.

9. The photomask of claim 8, wherein, on the outer region, the absorption layer extends between the dielectric pattern and a lateral surface of the reflection layer.

10. The photomask of claim 2, further comprising a capping layer between the reflection layer and the absorption structure,
    wherein, on the outer region, the dielectric pattern covers lateral surfaces of the absorption structure and the capping layer and extends onto the substrate.

11. The photomask of claim 10, wherein, on the outer region, the absorption structure and the capping layer extend between the dielectric pattern and a lateral surface of the reflection layer.

12. The photomask of claim 1, wherein
    the substrate has a first surface and a second surface facing each other,
    the reflection layer, the absorption structure, and the dielectric pattern are on the first surface of the substrate, and
    the photomask further comprises a lower capping layer on the second surface of the substrate.

13. A photomask, comprising:
a substrate including a pattern region and a peripheral region around the pattern region;
a reflection layer and an absorption structure sequentially stacked on the substrate; and
a dielectric pattern on the absorption structure on the peripheral region,
wherein the dielectric pattern has a ring shape extending along an edge of the substrate.

14. The photomask of claim 13, wherein the dielectric pattern includes an opening exposing the absorption structure on the pattern region.

15. The photomask of claim 14, wherein
the absorption structure has an outermost lateral surface indented from the edge of the substrate, and
the dielectric pattern covers the outermost lateral surface of the absorption structure and extends onto a surface of the substrate.

16. The photomask of claim 13, wherein the absorption structure includes:
a plurality of absorption patterns on the pattern region; and
an absorption layer on the peripheral region,
wherein the dielectric pattern is on the absorption layer and exposes the absorption patterns.

17. The photomask of claim 16, wherein the dielectric pattern covers a portion of the absorption layer and exposes a remaining portion of the absorption layer, the portion being proximal to the edge of the substrate, and the remaining portion being distal to the edge of the substrate.

18. The photomask of claim 16, wherein
the absorption layer has an outermost lateral surface indented from the edge of the substrate, and
the dielectric pattern covers the outermost lateral surface of the absorption layer.

19. The photomask of claim 18, further comprising a capping layer between the reflection layer and the absorption structure, wherein
the capping layer has an outermost lateral surface indented from the edge of the substrate, and
the dielectric pattern covers the outermost lateral surface of the capping layer.

20. The photomask of claim 19, wherein
the reflection layer is between the substrate and the capping layer and has an outermost lateral surface indented from the edge of the substrate, and
the absorption layer and the capping layer extend between the dielectric pattern and the outermost lateral surface of the reflection layer.

* * * * *